(12) United States Patent
Moriya et al.

(10) Patent No.: US 9,287,156 B2
(45) Date of Patent: Mar. 15, 2016

(54) ELECTROSTATIC CHUCKING DEVICE

(71) Applicant: Sumitomo Osaka Cement Co., Ltd., Tokyo (JP)

(72) Inventors: Yoshiaki Moriya, Tokyo (JP); Yukio Miura, Tokyo (JP); Shinichi Maeta, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 31 days.

(21) Appl. No.: 14/155,591

(22) Filed: Jan. 15, 2014

(65) Prior Publication Data

US 2014/0204501 A1 Jul. 24, 2014

(30) Foreign Application Priority Data

Jan. 18, 2013 (JP) ................................. 2013-007460

(51) Int. Cl.
*H01L 21/683* (2006.01)
*H01L 21/67* (2006.01)

(52) U.S. Cl.
CPC ...... *H01L 21/6833* (2013.01); *H01L 21/67103* (2013.01)

(58) Field of Classification Search
CPC . G03F 7/70708; H02N 13/00; H01L 21/6833
USPC ....................................................... 361/234
See application file for complete search history.

(56) References Cited

U.S. PATENT DOCUMENTS

| | | | | |
|---|---|---|---|---|
| 5,801,915 | A | * 9/1998 | Kholodenko et al. | ........ 361/234 |
| 7,312,974 | B2 | * 12/2007 | Kuchimachi | .................. 361/234 |
| 2009/0168292 | A1 | * 7/2009 | Watanabe et al. | ............. 361/234 |
| 2012/0299253 | A1 | * 11/2012 | Kosakai et al. | ............... 279/128 |

FOREIGN PATENT DOCUMENTS

| | | |
|---|---|---|
| JP | 05-087177 B | 12/1993 |
| JP | 09-283606 A | 10/1997 |

* cited by examiner

*Primary Examiner* — Thienvu Tran
*Assistant Examiner* — Lucy Thomas
(74) *Attorney, Agent, or Firm* — Wood, Herron & Evans, LLP

(57) ABSTRACT

The electrostatic chucking device 1 of the invention includes an electrostatic chucking portion 2 which includes a plate-like body 11, a top surface 11*a* of which is used as a mounting surface that mounts a plate-like specimen W, an electrostatic adsorption electrode 12 provided in the plate-like body 11 and a power-feeding terminal 13 that applies a direct-current voltage to the electrostatic adsorption electrode 12; and a base portion 31 that supports the electrostatic chucking portion 2, in which the plate-like body 11 is a corrosion-resistant ceramic, a circular insulation member 21 is provided in a circumferential edge portion between the electrostatic chucking portion 2 and the base portion 31, and a heat radiation plate 34 is provided on the top surface 31*a* of the base portion 31.

8 Claims, 2 Drawing Sheets

ELECTROSTATIC CHUCKING DEVICE

TECHNICAL FIELD

The present invention relates to an electrostatic chucking device, and, in more detail, to an electrostatic chucking device preferably used when carrying out a treatment such as plasma etching on a semiconductor substrate such as a silicon wafer.

BACKGROUND ART

In recent years, in the semiconductor industry which supports rapidly advancing IT technologies, there has been a demand for high integration or performance improvement of devices, and, accordingly, there has been a demand for additional improvement of micro-fabrication techniques in semiconductor-manufacturing processes as well. Even in semiconductor-manufacturing processes, etching techniques are one kind of important micro-fabrication technique, and, in recent years, among etching techniques, plasma etching techniques that can micro-fabricate a large area at a high efficiency have become mainstream.

For example, an LSI-manufacturing process in which a silicon wafer is used is a technique in which a mask pattern is formed on the silicon wafer using a resist, while the silicon wafer is supported in a vacuum, a reactive gas is introduced into the vacuum, a high-frequency electric field is applied to the reactive gas so as to make accelerated electrons collide with gas molecules and thus enter into a plasma state, radicals (free radicals) and ions which are generated from the plasma are made to react with the silicon wafer, and reaction products are removed, thereby forming a micro pattern on the silicon wafer.

In apparatuses for manufacturing semiconductors such as plasma etching apparatuses, an electrostatic chucking device has been thus far used as a device that readily attaches and fixes a silicon wafer to a specimen stage and maintains the silicon wafer at a desired temperature.

Examples of the electrostatic chucking device that has been proposed include an electrostatic chucking device having a structure in which an organic film such as a polyimide film is used as a dielectric layer that fixes a silicon wafer, and the organic film is sandwiched between two ceramic sheets and adhered using an insulating adhesive (PTL 1).

In addition, an electrostatic chucking device in which the top surface of a ceramic substrate is used as amounting surface that mounts a silicon wafer and in which an electrostatic adsorption electrode made of a metal with a high melting point is implanted also has been proposed (PTL 2). In addition, an electrostatic chucking device including a ceramic sprayed film formed on a surface of a ceramic substrate that mounts a silicon wafer is also proposed.

CITATION LIST

Patent Literature

[PTL 1] Japanese Examined Patent Application Publication No. 5-87177
[PTL 2] Japanese Laid-open Patent Publication No. 9-283606

SUMMARY OF INVENTION

Technical Problem

However, in an electrostatic chucking device of the related art in which a ceramic substrate was used, since heat was unevenly transferred in the ceramic substrate, there was a problem in that the surface temperature of a plate-like specimen such as a silicon wafer which is mounted on the ceramic substrate became uneven in the in-plane direction, and thus variation in characteristic caused by the uneven surface temperature in the in-plane direction was caused in the obtained LSI, and, sometimes, poor products were produced.

In addition, since heat was unevenly transferred in the ceramic substrate, in a case in which a thermal stress was applied to the ceramic substrate, there was a problem in that the thermal stress was concentrated in regions in the ceramic substrate in which heat was easily transferred, and the ceramic substrate cracked, and, sometimes, fractured.

The invention has been made to solve the above-described problems, and an object of the invention is to provide an electrostatic chucking device that enables uniform heat transfer in a plate-like body that mounts a plate-like specimen and thus can prevent the occurrence of cracking or fracture caused by the uneven heat transfer.

Solution to Problem

As a result of comprehensive studies to solve the above-described problems, the present inventors and the like found that, when a plate-like body in an electrostatic chucking portion is made of a corrosion-resistant ceramic, a circular insulation member is provided in a circumferential edge portion between the electrostatic chucking portion and a base stage, and a heat radiation plate is provided on a principal surface of the base stage on an electrostatic chucking portion side, it is possible to eliminate the uneven heat transfer in the plate-like body that mounts a plate-like specimen, and, furthermore, to prevent the occurrence of cracking or fracture caused by the uneven heat transfer; and the inventors and the like completed the invention.

That is, an electrostatic chucking device of the invention includes an electrostatic chucking portion which includes a plate-like body, a principal surface of which is used as a mounting surface that mounts a plate-like specimen, an electrostatic adsorption electrode provided in the plate-like body and a power-feeding terminal that applies a direct-current voltage to the electrostatic adsorption electrode; and a base stage that is provided on the other principal surface and supports the electrostatic chucking portion, in which the plate-like body is made of a corrosion-resistant ceramic, a circular insulation member is provided in a circumferential edge portion between the electrostatic chucking portion and the base stage, and a heat radiation plate is provided on a principal surface of the base stage on an electrostatic chucking portion side.

The corrosion-resistant ceramic is preferably made of one or more oxides selected from a group consisting of yttrium aluminum oxide composite oxides, rare earth element-added yttrium aluminum oxide composite oxides and yttrium oxide.

The heat radiation plate is preferably made of metal or an organic resin having thermal conductivity.

The mounting surface preferably includes a plurality of protrusion portions having a diameter smaller than the thickness of the plate-like specimen.

The surface roughness Ra of an end surface of the power-feeding terminal on an electrostatic adsorption electrode side is preferably in a range of 0.05 μm to 1.0 μm.

Advantageous Effects of Invention

According to the electrostatic chucking device of the invention, since the plate-like body that mounts a plate-like specimen is made of a corrosion-resistant ceramic, the circular insulation member is provided in the circumferential edge portion between the electrostatic chucking portion and the base stage, and the heat radiation plate is provided on the principal surface of the base stage on the electrostatic chucking portion side, it is possible to make heat uniformly transferred in the plate-like body. In addition, it is possible to induce heat generated from the plate-like body to rapidly move toward the base stage using the circular insulation member and to rapidly radiate heat outside using the heat radiation plate provided on one principal surface of the base stage. Therefore, it is possible to uniformly transfer heat in the plate-like body that mounts a plate-like specimen and thus to prevent the occurrence of cracking or fracture caused by uneven heat transfer.

DESCRIPTION OF EMBODIMENTS

An embodiment of an electrostatic chucking device of the invention will be described with reference to the accompanying drawings.

Meanwhile, the embodiment is merely a specific description to facilitate better understanding of the purpose of the invention, and does not limit the invention unless specifically stated.

Figure 1:
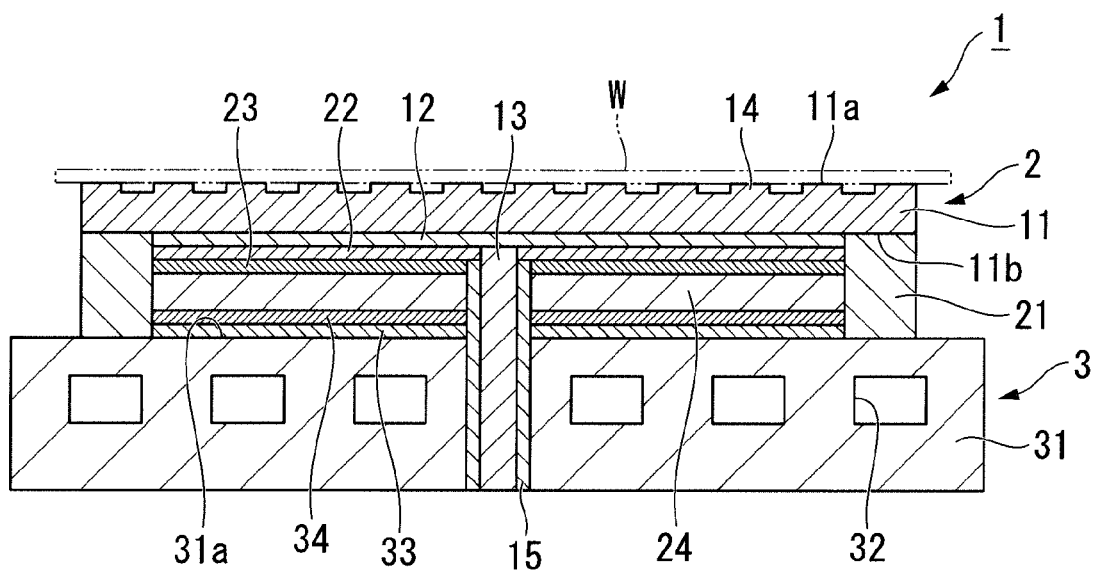
FIG. 1 is a cross-sectional view showing an electrostatic chucking device according to an embodiment of the invention.

FIG. 1 is a cross-sectional view showing an electrostatic chucking device of an embodiment of the invention, and the electrostatic chucking device 1 is made up of an electrostatic chucking portion 2 that mounts and fixes a wafer W and a cooling base portion 3 that supports and cools the electrostatic chucking portion 2.

The electrostatic chucking portion 2 includes a disc-like plate-like body 11, a top surface (a principal surface) 11a of which is used as a mounting surface that mounts the wafer W, an electrostatic adsorption electrode 12 provided on a bottom surface (the other principal surface) 11b of the plate-like body 11, and a power-feeding terminal 13 that applies a direct-current voltage to the electrostatic adsorption electrode 12.

A circular insulation member 21 is attached and fixed to a circumferential edge portion of the bottom surface 11b of the plate-like body 11 through an organic adhesive (not illustrated) so as to surround the electrostatic adsorption electrode 12.

In addition, a sheet-like or film-like insulation layer 23 is attached to the electrostatic adsorption electrode 12 through a sheet-like or film-like organic adhesive layer 22.

The cooling base portion 3 has a flow path 32 through which a cooling medium such as water or an organic solvent is made to flow formed in a thick disc-like base portion (base stage) 31, and the top surface 11a of the electrostatic chucking portion 2, which is the mounting surface for the wafer W, is controlled to a desired temperature by making a cooling medium that has been cooled to a desired temperature flow in the flow path 32.

A heat radiation plate 34 having the same shape as an organic adhesive layer 33 is provided on the top surface (one principal surface) 31a of the base portion 31 on an electrostatic chucking portion 2 side through the sheet-like or film-like organic adhesive layer 33.

In addition, the insulation layer 23 attached and fixed to the bottom surface 11b of the plate-like body 11 and the heat radiation plate 34 attached and fixed to the top surface 31a of the base portion 31 are attached and fixed to each other through the organic adhesive layer 24. In addition, the circular insulation member 21 attached and fixed to the circumferential edge portion of the bottom surface 11b of the plate-like body 11 is attached and fixed to the circumferential edge portion of the top surface 31a of the base portion 31 through an organic adhesive (not illustrated) while surrounding the electrostatic adsorption electrode 12, the organic adhesive layer 24 and the heat radiation plate 34.

Next, the electrostatic chucking device 1 of the embodiment will be described in detail.

The plate-like body 11 is an element that configures a principal portion of the electrostatic chucking portion 2, has a mechanical strength at a volume-intrinsic resistance in a range of approximately $10^8$ Ω·cm to $10^{15}$ Ω·cm, and, furthermore, is made of a corrosion-resistant ceramic having durability with respect to oxygen-based plasma or corrosive gas.

The corrosion-resistant ceramic preferably contains one or two or more selected from a group consisting of yttrium aluminum oxide composite oxides, rare earth element-added yttrium aluminum oxide composite oxides and yttrium oxide ($Y_2O_3$).

The shape of the corrosion-resistant ceramic may be a plate-like body made of only one of the above-described ceramics or a plate-like body in a laminate structure obtained by laminating two or more of the above-described ceramics.

Examples of the yttrium aluminum oxide composite oxides include yttrium aluminum garnet (YAG: $Y_3Al_5O_{12}$), $Y_2O_3$·$Al_2O_3$ composite oxides, $Y_2O_3$—$Al_2O_3$ mixed crystal oxides and the like.

Examples of the rare earth element (RE)-added yttrium aluminum oxide composite oxides include composite oxide obtained by adding a rare earth element (RE) made of one or more selected from a group consisting of lanthanum (La), selenium (Se), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu) or an oxide of the above-described rare earth element (RE) to the yttrium aluminum oxide composite oxide.

Among these, selenium oxide ($Se_2O_3$)-added yttrium aluminum garnet (YAG.Se), neodymium oxide ($Nd_2O_5$)-added yttrium aluminum garnet (YAG.Nd), samarium oxide ($Sm_2O_3$)-added yttrium aluminum garnet (YAG.Sm), gadolinium oxide ($Gd_2O_3$)-added yttrium aluminum garnet (YAG.Gd) and the like are preferable.

The addition rate of the rare earth element or the oxide of the rare earth element to the yttrium aluminum oxide composite oxide in the rare earth element (RE)-added yttrium aluminum composite oxide is preferably in a range of 0.01% by mass to 20% by mass, and more preferably in a range of 5% by mass to 10% by mass with respect to the total amount of the yttrium aluminum oxide composite oxide.

When the addition rate of the rare earth element (RE) is set in the above range, the corrosion resistance of the rare earth element (RE)-added yttrium aluminum oxide composite oxides with respect to halogen gas or plasma improves.

Yttrium oxide ($Y_2O_3$) may be solely used; however, when fine carbon particles, a carbon fiber (CF), a carbon nanotube (CNT) and the like are added, the conductivity further improves, which is preferable.

The thickness of the plate-like body 11 is preferably in a range of 0.5 mm to 2.0 mm. This is because, when the thickness of the plate-like body 11 is less than 0.5 mm, the risk of discharge due to a voltage applied to the electrostatic adsorption electrode 12 increases, and, when the thickness is larger than 2.0 mm, it is not possible to sufficiently attach and fix a plate-like specimen W, and therefore it becomes difficult to sufficiently cool the plate-like specimen W.

The thermal conductivity of the plate-like body 11, that is, the corrosion-resistant ceramic that configures the plate-like body 11 is preferably 5 W/mK or more, more preferably 7 W/mK or more, and still more preferably 10 W/mK or more.

Here, the reason for setting the thermal conductivity of the plate-like body 11 to 5 W/mK or more is that, when the thermal conductivity is less than 5 W/mK, heat cannot be sufficiently transferred in the plate-like body 11, and, consequently, the in-plane temperature distribution on the top surface 11a of the plate-like body 11 increases, and the variation in the characteristic of a semiconductor chip formed on the wafer W increases, which is not preferable.

A plurality of protrusion portions 14 having a diameter smaller than the thickness of the plate-like specimen W are formed on the top surface 11a of the plate-like body 11.

When a plurality of the protrusion portions 14 are formed on the top surface 11a of the plate-like body 11, flow paths for a cooling medium are formed between the protrusion portions 14 so that the uniformity of the in-plane temperature of the wafer W supported by the protrusion portions 14 increases, and, consequently, the amount of variation in the semiconductor chips formed on the wafer W becomes extremely small, and the yield of products improves.

As the cooling medium, He gas, $N_2$ gas or the like is preferably used.

The electrostatic adsorption electrode 12 is used as an electrostatic chucking electrode used to generate charges so as to fix the wafer W to the top surface 11a of the plate-like body 11 using an electrostatic adsorption force, and the shape and size of the electrostatic adsorption electrode are appropriately adjusted depending on how they are to be used.

The electrostatic adsorption electrode 12 is preferably configured of: a metal such as gold (Au), silver (Ag), copper (Cu), titanium (Ti), tungsten (W), molybdenum (Mo), platinum (Pt), tantalum (Ta), and niobium (Nb); a Kovar alloy which are non-magnetic materials; a carbon material such as graphite or carbon; a conductive ceramic such as silicon carbide (SiC), titanium nitride (TiN), titanium carbide (TiC) and tungsten carbide (WC); TiC—Ni-based cermet, TiC—Co-based cermet, $B_4C$—Fe-based cermet or other kinds of cermet; or the like. The thermal expansion coefficient of the above-described material is preferably as close as possible to the thermal expansion coefficient of the plate-like body 11.

The thickness of the electrostatic adsorption electrode 12 is not particularly limited; however, in a case in which the electrostatic adsorption electrode is used as an electrode for generating plasma, the thickness is preferably in a range of 0.1 μm to 100 μm, and particularly preferably in a range of 5 μm to 20 μm. This is because, when the thickness is less than 0.1 μm, it is not possible to ensure sufficient conductivity, and, when the thickness exceeds 100 μm, it becomes more likely to cause cracking in the junction interface between the plate-like body 11 and the electrostatic adsorption electrode 12 due to the difference in thermal expansion coefficients between the plate-like body 11 and the electrostatic adsorption electrode 12, and the insulation property degrades.

The electrostatic adsorption electrode 12 having a thickness in the above-described range can be easily formed using a film-forming method such as a sputtering method or a deposition method or a coating method such as a screen printing method.

The power-feeding terminal 13 is a rod-like element provided to apply a direct-current voltage to the electrostatic adsorption electrode 12, and a material for the power-feeding terminal 13 is not particularly limited as long as the material is a conductive material having excellent thermal resistance, but the material preferably has a thermal expansion coefficient that is close to the thermal expansion coefficient of the electrostatic adsorption electrode 12, and, for example, the metals, the carbon materials, the conductive ceramics, TiC—Ni-based cermet, TiC—Co-based cermet, $B_4C$—Fe-based cermet and other kinds of cermet, which are described above, are preferably used.

The power-feeding terminal 13 is insulated with respect to the heat radiation plate 34 and the base portion 31 using an insulator 15 having an insulation property.

Figure 2:
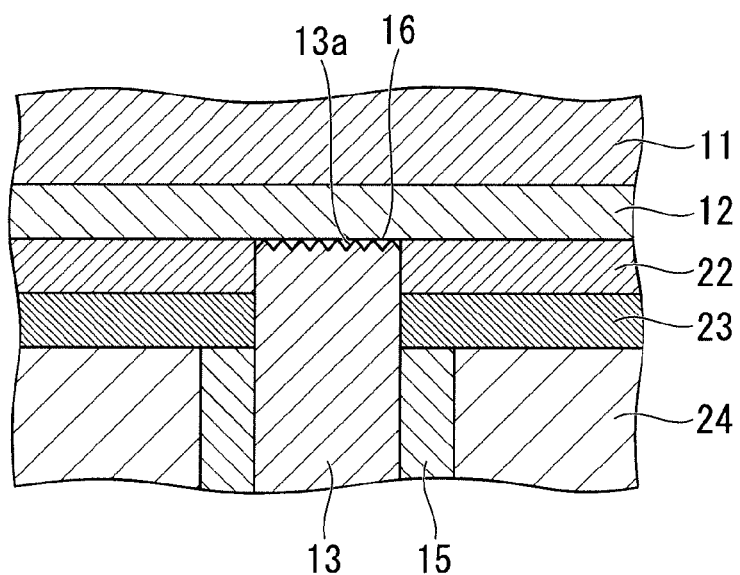
FIG. 2 is an enlarged cross-sectional view showing an end surface of a power-feeding terminal in the electrostatic chucking device according to the embodiment of the invention.

As illustrated in FIG. 2, an end surface 13a of the power-feeding terminal 13 is attached and fixed to a bottom surface of the electrostatic adsorption electrode 12 using a conductive organic adhesive 16.

Examples of the conductive organic adhesive 16 include an adhesive containing polyarylene such as polyacetylene (PA) and poly-p-phenylene (PPP); a polyarylene vinylene such as poly-2,5-thienylenevinylene (PTV) and poly-p-phenylenevinylene (PPV); heterocyclic polymers such as polypyrrole (PPy) and polythiophene (PT); a non-conjugated polymer such as polyaniline (PAn), or the like as a main component.

In addition, it is also possible to use a conductive particle-added organic adhesive obtained by adding an alkali metal such as lithium, sodium or potassium, a halogen element such as iodine or bromine, or fine metal particles such as fine iron particles, fine nickel particles or fine silver particles to an organic adhesive instead of the conductive organic adhesive 16.

The surface roughness Ra of the end surface 13a of the power-feeding terminal 13 on the electrostatic adsorption electrode 12 side is preferably in a range of 0.05 μm to 1.0 μm and more preferably in a range of 0.1 μm to 0.3 μm. Here, the reason for setting the surface roughness Ra of the end surface 13a in the above-described range is that, in a case in which the power-feeding terminal 13 and the electrostatic adsorption electrode 12 are electrically connected to each other through the conductive organic adhesive, the adhesiveness becomes favorable in the above-described range, and, consequently, the conductivity between the power-feeding terminal 13 and the electrostatic adsorption electrode 12 becomes favorable.

Meanwhile, when the surface roughness Ra of the end surface 13a is less than 0.05 μm, the adhesiveness between the end surface 13a of the power-feeding terminal 13 and the electrostatic adsorption electrode 12 decreases such that the power-feeding terminal may easily slide, consequently, the adhesiveness between the power-feeding terminal 13 and the electrostatic adsorption electrode 12 decreases, and therefore the conductivity decreases, which is not preferable. On the other hand, when the surface roughness Ra of the end surface 13a exceeds 1.0 μm, the end surface of the power-feeding terminal 13 becomes too coarse such that, when the power-feeding terminal is attached and fixed to the electrostatic adsorption electrode, the thickness of an adhesive being used becomes uneven, and it becomes difficult to relieve the difference in thermal expansion coefficients between the respective members when the electrostatic chucking device is used, which is not preferable.

Meanwhile, the insulation member 21 is a circular element provided so as to prevent the radiation of heat to the outside, is disposed so that the inner circumferential surface comes into contact with the outer edge portion of the electrostatic adsorption electrode 12, and is made of an insulating ceramic having a larger thermal conductivity than the corrosion-resistant ceramic that configures the plate-like body 11.

Since the thermal conductivity of the corrosion-resistant ceramic that configures the plate-like body 11 is less than 20 W/mK, the thermal conductivity of the insulating ceramic needs to be at least 20 W/mK or more.

Examples of the insulating ceramic having a thermal conductivity of 20 W/mK or more include ceramics that have mechanical strength and durability with respect to corrosive gas and plasma thereof such as aluminum oxide ($Al_2O_3$), aluminum nitride (AlN), aluminum oxide-silicon carbide ($Al_2O_3$—SiC) and aluminum nitride containing 3% by mass to 7% by mass of yttrium oxide ($Y_2O_3$).

The organic adhesive layer 22 is an element having the same shape as the electrostatic adsorption electrode 12, and is provided so as to be attached to the bottom surface of the electrostatic adsorption electrode 12. The organic adhesive layer 22 is a sheet-like or film-like adhesive made of acryl, epoxy or polyethylene, and is preferably a thermally compressed organic adhesive sheet or film.

The reason is that, when the thermally compressed organic adhesive sheet or film is stacked on the electrostatic adsorption electrode 12, put into a vacuum, and then thermally compressed, air bubbles and the like are not easily generated between the sheet or film and the electrostatic adsorption electrode 12 so that the sheet or film is not easily peeled from the electrostatic adsorption electrode, and it is possible to favorably hold the adsorption characteristics or voltage resistance of the electrostatic chucking portion 2.

The thickness of the organic adhesive layer 22 is not particularly limited; however, when adhesion strength, ease of handling and the like are taken into account, the thickness is preferably in a range of 40 μm to 100 μm, and more preferably in a range of 55 μm to 100 μm.

When the thickness is in a range of 55 μm to 100 μm, the adhesion strength with the interface of the electrode further improves, and, furthermore, the thickness of the organic adhesive layer 22 becomes more uniform. Consequently, the thermal conductivity between the plate-like body 11 and the base portion 31 becomes uniform, the cooling characteristics of the mounted wafer W become uniform, and the in-plane temperature of the wafer W becomes uniform.

Meanwhile, when the thickness of the organic adhesive layer 22 is less than 40 μm, the thermal conductivity between the electrostatic chucking portion 2 and the base portion 31 becomes favorable, but it becomes impossible to compensate for the level difference of the electrode due to the thermal softening of the adhesive layer, and there is a higher probability of the organic adhesive layer peeling from the interface of the electrode. On the other hand, when the thickness exceeds 100 μm, it becomes impossible to sufficiently ensure the thermal conductivity between the electrostatic chucking portion 2 and the base portion 31, and the cooling efficiency decreases, which is not preferable.

As described above, when a sheet-like or film-like adhesive is used as the organic adhesive layer 22, the thickness of the organic adhesive layer 22 becomes uniform, and the thermal conductivity between the plate-like body 11 and the base portion 31 becomes uniform. Therefore, the cooling characteristics of the wafer W become uniform, and the in-plane temperature of the wafer W becomes uniform.

The insulation layer 23 is an element having almost the same shape as the organic adhesive layer 22, and is provided so as to be attached to the bottom surface of the organic adhesive layer 22. The insulation layer 23 is a sheet-like or film-like insulating material made of an insulating resin that can endure a voltage applied to the electrostatic chucking portion 2 such as polyimide, polyamide and aromatic polyamide.

The thickness of the insulation layer 23 is preferably in a range of 10 μm to 200 μm, and more preferably in a range of 10 μm to 70 μm.

The reasons are as follows. When the thickness of the insulation layer 23 is less than 10 μm, the insulation property with respect to the electrostatic adsorption electrode 12 decreases, the electrostatic adsorption force becomes weak, and it becomes impossible to favorably fix the wafer W to the mounting surface. On the other hand, when the thickness exceeds 200 μm, it becomes impossible to sufficiently ensure the thermal conductivity between the electrostatic chucking portion 2 and the base portion 31, and the cooling efficiency decreases.

When the circular insulation member 21 is provided so as to surround the electrostatic adsorption electrode 12, the organic adhesive layer 22 and the insulation layer 23, the electrostatic adsorption electrode 12, the organic adhesive layer 22 and the insulation layer 23 obtain improved plasma resistance with respect to oxygen-based plasma and improved corrosion resistance with respect to corrosive gas, and the generation of particles and the like is suppressed.

The organic adhesive layer 24 attaches and fixes the insulation layer 23 formed on the bottom surface of the plate-like body 11 and the heat radiation plate 34 formed on the top surface 31a of the base portion 31 to each other, thereby forming a structure in which the electrostatic chucking portion 2, the cooling base portion 3 and the circular insulation member 21 are integrated.

In order to rapidly radiate heat from the plate-like body 11 to the heat radiation plate 34, the organic adhesive layer 24 is preferably a material which has a high thermal conductivity and a high cooling efficiency from the base portion 31, and preferable examples thereof include silicone-based resin compositions which are resins having excellent thermal resistance and excellent elasticity.

The silicone-based resin composition is a silicon compound having a siloxane bond (Si—O—Si), and can be represented using, for example, a chemical formula of the following formula (1) or (2).

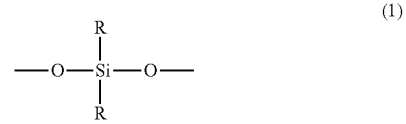

Here, R represents H or an alkyl group ($C_nH_{2n+1}$—: n represents an integer).

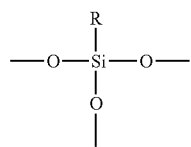

(2)

Here, R represents H or an alkyl group ($C_nH_{2n+1}$—: n represents an integer).

A silicone resin having a thermal curing temperature in a range of 70° C. to 140° C. is particularly preferably used as the silicone resin.

Here, when the thermal curing temperature is lower than 70° C., when the insulation layer 23 and the heat radiation plate 34 are joined, curing begins in the middle of the joining step, and there is a concern that joining may be hindered, which is not preferable. On the other hand, when the thermal curing temperature exceeds 140° C., it is not possible to absorb the difference in thermal expansion coefficients between the insulation layer 23 and the heat radiation plate 34 such that the joining force between the insulation layer 23 and the heat radiation plate 34 decreases, and there is a concern that the insulation layer and the heat radiation plate may peel away from each other, which is not preferable.

The thermal conductivity of the organic adhesive layer 24 is preferably 0.25 W/mk or more, and more preferably 0.5 W/mk or more.

Here, the reason for limiting the thermal conductivity of the organic adhesive layer 24 to 0.25 W/mk or more is that, when the thermal conductivity is less than 0.25 W/mk, the cooling efficiency from the base portion 31 decreases, and it becomes impossible to efficiently cool the wafer W mounted on the top surface 11a of the plate-like body 11 of the electrostatic chucking portion 2.

The thickness of the organic adhesive layer 24 is preferably in a range of 0.1 µm to 0.8 µm, and more preferably in a range of 0.2 µm to 0.4 µm.

When the thickness of the organic adhesive layer 24 is less than 0.1 µm, the organic adhesive layer becomes too thin such that it becomes impossible to sufficiently ensure the adhesion strength, and there is a concern that the insulation layer 23 and the heat radiation plate 34 may peel away from each other. On the other hand, when the thickness exceeds 0.8 µm, it becomes impossible to sufficiently ensure the thermal conductivity between the insulation layer 23 and the heat radiation plate 34, and there is a concern that the cooling efficiency may decrease.

In order to control the thermal conductivity, the organic adhesive layer 24 preferably contains a filler having an average particle diameter in a range of 1 µm to 10 µm, for example, surface-coated aluminum nitride (AlN) particles having a coating layer made of silicon oxide ($SiO_2$) formed on the surface of an aluminum nitride (AlN) particle.

The surface-coated aluminum nitride (AlN) particles are incorporated in order to improve the thermal conduction of the silicone resin, and the thermal conductivity can be controlled by adjusting the incorporation rate.

Meanwhile, the base portion 31 is an element to makes a cooling medium such as water or an organic solvent which has been cooled to a predetermined temperature flow in the flow path 32 so as to cool the electrostatic chucking portion 2 and adjust the temperature pattern as desired, thereby cooling the wafer W being mounted and thus adjusting the temperature, and is a thick disc-like element. The base portion has a building frame which is connected to an external high-frequency power supply (not illustrated).

A material that configures the base portion 31 is not particularly limited as long as the material is any metal or metal-ceramic complex material which is excellent in terms of thermal conductivity, conductivity and workability, and examples thereof that can be preferably used include aluminum (Al), copper (Cu), stainless steel (SUS) and the like. A side surface of the base portion 31, that is, at least a surface that is exposed to plasma is preferably alumited or coated with an insulating spray material such as alumina or yttria.

In the base portion 31, when at least a surface that is exposed to plasma is alumited or an insulating film is formed on the surface, the plasma resistance improves, abnormal discharge is prevented, and thus plasma-resisting stability improves. In addition, the surface is not easily damaged, and therefore it is possible to prevent the occurrence of damage.

The heat radiation plate 34 is not particularly limited as long as the heat radiation plate is a material that can rapidly radiate heat generated from the plate-like body 11 to the outside; however, when the use of the heat radiation plate at a high temperature is taken into account, metals, conductive organic resins and the like are preferably used.

Examples of the metals include aluminum, aluminum alloys, copper, copper alloys, stainless steel, copper (Cu), titanium (Ti), tungsten (W), molybdenum (Mo), platinum (Pt), tantalum (Ta), niobium (Nb), Kovar alloys, and the like.

In addition, examples of the conductive organic resin include polyarylene such as polyacetylene (PA) and poly-p-phenylene (PPP), polyarylene vinylene such as poly-2,5-thienylenevinylene (PTV) and poly-p-phenylenevinylene (PPV), heterocyclic polymers such as polypyrrole (PPy) and polythiophene (PT), a non-conjugated polymer such as polyaniline (PAn), and the like.

The metal or the conductive organic resin may be solely used, or two or more kinds of metal foils or conductive organic resins adhered into a laminate structure or a complex material in a laminate structure which is obtained by adhering metal foils or conductive organic resins may be used.

The organic adhesive layer 33 that attaches and fixes the heat radiation plate 34 to the top surface 31a of the base portion 31 may be a sheet-like or film-like organic adhesive which has a high thermal conductivity and a high cooling efficiency from the base portion 31, and, for example, similarly to the organic adhesive layer 22, the organic adhesive layer 33 is a sheet-like or film-like adhesive made of acryl, epoxy, polyethylene or the like, and is preferably a thermally compressed organic adhesive sheet or film.

Next, a method for manufacturing the electrostatic chucking device 1 will be described.

First, the electrostatic chucking portion 2 is produced using a well-known method.

Here, the plate-like body 11 is produced using any one of yttrium aluminum oxide composite oxides, rare earth element-added yttrium aluminum oxide composite oxides and yttrium oxide ($Y_2O_3$).

For example, in a case in which an yttrium aluminum oxide composite oxide is used, yttrium oxide powder and aluminum oxide powder are respectively mixed at a predetermined ratio, thereby producing a mixture.

In this case, a solvent such as water or an alcohol or a dispersion medium may be added as necessary.

In a mixing method, an ultrasonic disperser; a disperser such as a planetary ball mill, a ball mill or a sand mill in which resin-coated metal balls, agate balls or the like are used as media; or a medium-free disperser such as a ultrahigh pressure crushing and dispersion machine is used. Particularly, since there is no concern that impurities may be incorporated into the mixture from the media, the medium-free disperser is preferable when producing an electrostatic chucking device for a semiconductor-manufacturing apparatuses.

Next, the mixture is made into granules having a predetermined grain diameter using a granulating apparatus such as an automatic mortar or a spray dryer, the granules are formed into a desired shape, the obtained compact is heated, for example, to a temperature in a range of 50° C. to 1000° C. in the atmosphere so as to dissipate (defat) volatile components in the compact, and, subsequently, the compact is fired in any atmosphere of the atmosphere, a vacuum, an inert atmosphere and a reducing atmosphere at a temperature in a range of 1500° C. to 1800° C. and preferably in a range of 1600° C. to 1750° C. for 2 hours to 4 hours, whereby the plate-like body 11 can be obtained.

A firing method may be firing at normal pressure as described above; however, in order to obtain a dense plate-like body 11, a pressurized firing method such as hot press (HP) or hot isostatic press (HIP) is preferable.

The pressurizing force in the pressurized firing method is not particularly limited, but is generally in a range of approximately 20 MPa to 25 MPa.

The plate-like body 11 obtained in the above manner, furthermore, may be heated in either atmosphere of a vacuum or a reducing atmosphere at a temperature in a range of 700° C. to 1500° C. and preferably in a range of 1000° C. to 1200° C. for 2 hours to 4 hours.

Next, the bottom surface 11b of the plate-like body 11 is defatted and washed using, for example, acetone, and the electrostatic adsorption electrode 12 is formed on the bottom surface 11b using a film-forming method such as a sputtering method or a deposition method or a coating method such as a screen printing method.

Next, a sheet-like or film-like adhesive resin which has thermal resistance and an insulation property, such as a polyimide resin, a silicone resin or an epoxy resin, and has almost the same shape as the electrostatic adsorption electrode 12 is adhered to a predetermined region on the surface (bottom surface) of the electrostatic adsorption electrode 12, thereby producing the organic adhesive layer 22.

The organic adhesive layer 22 can be also produced by adhering a sheet-like or film-like adhesive resin so as to cover the entire surface including the electrostatic adsorption electrode 12, and mechanically processing the sheet-like or film-like adhesive resin into almost the same shape as the electrostatic adsorption electrode 12.

Next, a sheet-like or film-like insulation material made of an insulating resin which has almost the same shape as the organic adhesive layer 22, such as polyimide, polyamide or aromatic polyamide, is attached to a predetermined region on the surface (bottom surface) of the organic adhesive layer 22, thereby producing the insulation layer 23. Then, it is possible to produce an electrostatic chuck including the electrostatic adsorption electrode 12, the organic adhesive layer 22 and the insulation layer 23 formed on the bottom surface 11b of the plate-like body 11.

Meanwhile, a metallic material made of aluminum (Al), an aluminum alloy, copper (Cu), a copper alloy, stainless steel (SUS) or the like is mechanically worked, the flow path 32 that circulates water in the metallic material is formed, and, furthermore, fixing holes are formed in order to engage and hold the power-feeding terminal 13 and the insulator 15, thereby producing the base portion 31.

At least a surface of the base portion 31 which is exposed to plasma is preferably alumited or an insulation film such as alumina is preferably formed on the surface.

Next, the top surface 31a of the base portion 31 is defatted and washed using, for example, acetone, and a sheet-like or film-like organic adhesive made of acryl, epoxy, polyethylene or the like is attached to a predetermined location on the top surface 31a, thereby producing the organic adhesive layer 33. Next, the heat radiation plate 34 made of a metal or a conductive organic resin which has almost the same shape as the organic adhesive layer 33 is mounted on a predetermined location of the organic adhesive layer 33, and pressurized at a predetermined pressure, thereby attaching and fixing the heat radiation plate 34 onto the organic adhesive layer 33. Then, it is possible to produce the cooling base portion 3 including the organic adhesive layer 33 and the heat radiation plate 34 sequentially stacked on the top surface 31a of the base portion 31.

Next, the power-feeding terminal 13 having a predetermined size and a predetermined shape is produced. For example, in a case in which the power-feeding terminal 13 is made of a conductive complex sintered compact, conductive ceramic powder may be molded into a desired shape, pressurized, and fired.

In addition, in a case in which the power-feeding terminal 13 is made of a metal, the power-feeding terminal may be formed using a metal with a high melting point and a forming method in which a grinding method or a metallic working method such as powder metallurgy is used.

The surface roughness Ra of the end surface 13a of the power-feeding terminal 13 is set in a range of 0.05 µm to 0.2 µm by carrying out etching or a mechanical working on the end surface.

Next, the insulation member 21 having a predetermined size and a predetermined shape is produced. For example, a molding material containing an insulating ceramic, such as aluminum oxide ($Al_2O_3$), aluminum nitride (AlN), aluminum oxide-silicon carbide ($Al_2O_3$—SiC) or aluminum nitride (AlN) containing 3% by mass to 7% by mass of yttrium oxide ($Y_2O_3$), and a binder such as polyvinyl alcohol (PVA) is molded into a predetermined size and a predetermined shape, and the obtained compact is fired in any atmosphere of the atmosphere, a vacuum, an inert atmosphere and a reducing atmosphere at a temperature in a range of 1500° C. to 2000° C. and preferably in a range of 1700° C. to 1900° C. for 2 hours to 4 hours, whereby the insulation member 21 can be obtained.

Next, the power-feeding terminal 13 and the insulator 15 are engaged and fixed to the fixing holes in the cooling base portion 3, and the insulation member 21 is attached and fixed to a predetermined location on the top surface of the cooling base portion 3 using an organic adhesive (not illustrated).

Next, an organic adhesive is loaded in recess portions formed by the heat radiation plate 34 and the inside of the insulation member 21 of the cooling base portion 3 to a predetermined depth.

Next, the insulation layer 23 of the electrostatic chucking portion 2 is moved onto the organic adhesive of the cooling base portion 3, the electrostatic chucking portion 2 is pressurized to the cooling base portion 3 at a predetermined pressure, and then heated to a predetermined temperature, thereby curing the organic adhesive.

In the above manner, it is possible to manufacture the electrostatic chucking device 1 of the embodiment.

As described above, according to the electrostatic chucking device 1 of the embodiment, since the plate-like body 11 that is mounted on the plate-like specimen W is made of a corrosion-resistant ceramic, the circular insulation member 21 is provided in the circumferential edge portion between the electrostatic chucking portion 2 and the base portion 31 in the cooling base portion 3, and, furthermore, the heat radiation plate 34 is provided on the top surface 31a of the base portion 31, it is possible to make heat uniformly transferred in the plate-like body 11. In addition, it is possible to induce heat generated from the plate-like body 11 to rapidly move to the top surface 31a of the base portion 31 using the circular insulation member 21, and to rapidly dissipate the heat to the outside using the heat radiation plate 34 provided on the top surface 31a of the base portion 31. Therefore, it is possible to make heat uniformly transferred in the plate-like body 11 that is mounted on the plate-like specimen W, and thus it is possible to prevent the occurrence of cracking or fracture caused by the uneven heat transfer.

Figure 3:
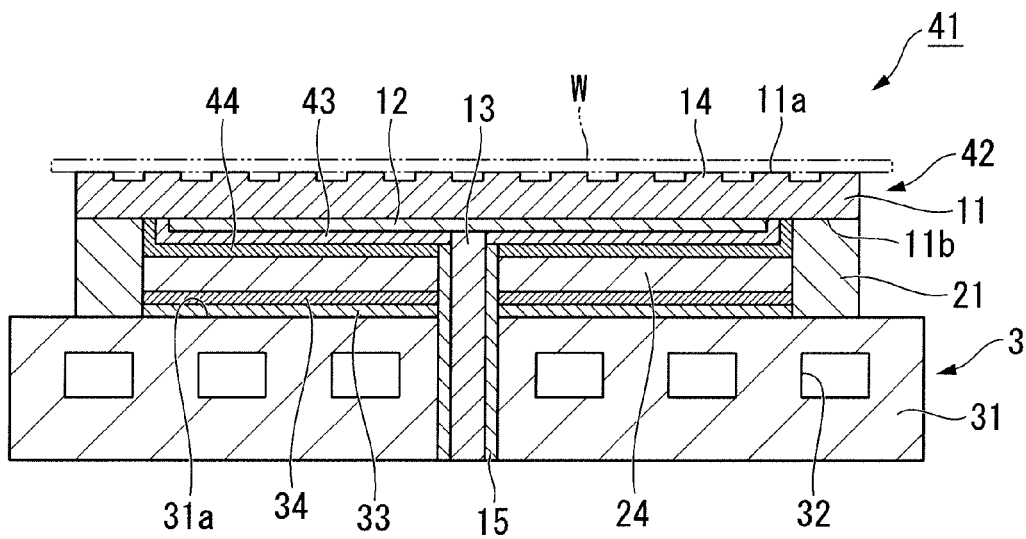
FIG. 3 is a cross-sectional view showing a modified example of the electrostatic chucking device according to the embodiment of the invention.

FIG. 3 is a cross-sectional view showing a modification example of the electrostatic chucking device of the embodiment, and the differences of an electrostatic chucking device 41 from the above-described electrostatic chucking device 1 are that a sheet-like or film-like organic adhesive layer 43 is formed so as to cover the bottom surface and the side surfaces of the electrostatic adsorption electrode 12 in an electrostatic chucking portion 42, a sheet-like or film-like insulation layer 44 is attached so as to cover the bottom surface and the side surfaces of the organic adhesive layer 43, and the heat radiation plate 34 on the base portion 31 is attached to the sheet-like or film-like insulation layer 44 through the organic adhesive layer 24.

In the electrostatic chucking device 41 as well, it is possible to exhibit the same effects as the above-described electrostatic chucking device 1.

Furthermore, since the sheet-like or film-like organic adhesive layer 43 is formed so as to cover the bottom surface and the side surfaces of the electrostatic adsorption electrode 12, and the sheet-like or film-like insulation layer 44 is attached so as to cover the bottom surface and the side surfaces of the organic adhesive layer 43, it is possible to improve the voltage resistance of the electrostatic adsorption electrode 12.

Figure 4:
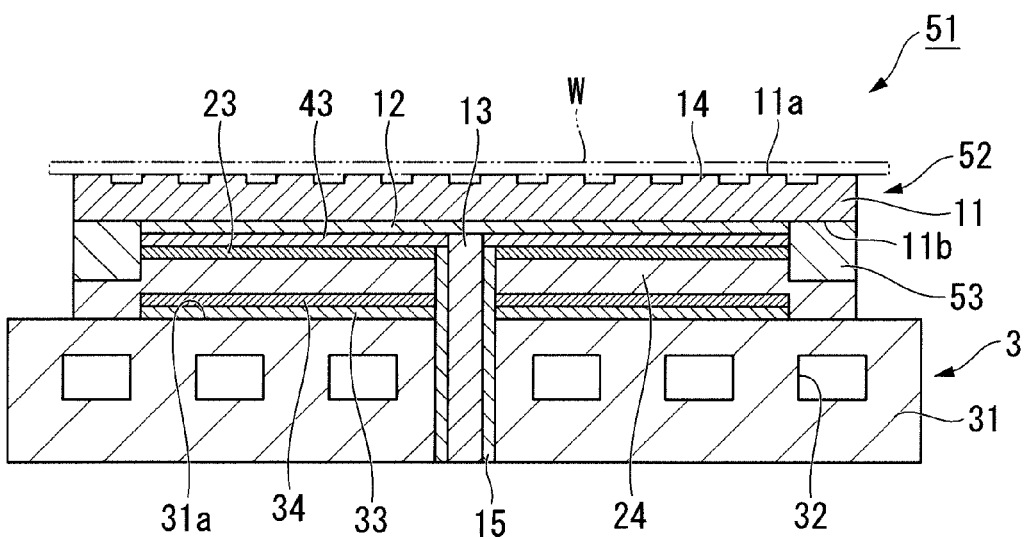
FIG. 4 is a cross-sectional view showing another modified example of the electrostatic chucking device according to the embodiment of the invention.

FIG. 4 is a cross-sectional view showing another modification example of the electrostatic chucking device of the embodiment, and the differences of an electrostatic chucking device 51 from the above-described electrostatic chucking device 1 are that a circular insulation member 53 that is thinner than the insulation member 21 is used, the insulation member 53 is attached and fixed to the circumferential edge portion of the bottom surface 11b of the plate-like body 11 in an electrostatic chucking portion 52 through an organic adhesive (not illustrated), and the insulation member 53 and the insulation layer 23 are attached and fixed to the heat radiation plate 34 on the top surface 31a of the base portion 31 through the organic adhesive layer 24.

In the electrostatic chucking device 51 as well, it is possible to exhibit the same effects as those exhibited by the above-described electrostatic chucking device 1.

Furthermore, since the insulation member 53 covers the electrostatic adsorption electrode 12, the organic adhesive layer 22 and the insulation layer 23, it is possible to exhibit the same actions and the same effects as the insulation member 21.

EXAMPLES

Hereinafter, the invention will be specifically described using examples and comparative examples, but the invention is not limited to the examples.

Example 1

Production of an Electrostatic Chucking Device

First, a plate-like body 11 made of yttrium aluminum garnet (YAG: $Y_3Al_5O_{12}$) was prepared. The plate-like body 11 had a disc shape with a diameter of 300 mm and a thickness of 1 mm. In addition, the number of protrusion portions 14 with a height of 15 μm are formed on a top surface of the plate-like body 11, to which a wafer W was to be electrostatically adsorbed, so as to make the surface uneven, top surfaces of the protrusion portions 14 were used as surfaces on which the plate-like specimen W is mounted, and cooling gas was able to flow through grooves being formed between recess portions on the uneven surface and the electrostatically adsorbed plate-like specimen W.

In addition, a bottom surface 11a of the plate-like body 11 was defatted and washed using acetone, and conductive paste FC415 (manufactured by Fujikura Kasei Co., Ltd.) was applied to the bottom surface 11a using a screen printing method and the plate-like body was fired in the atmosphere at 300° C. for 10 hours, thereby forming a 10 μm-thick electrostatic adsorption electrode 12.

Next, a 50 μm-thick polyimide film 200H (manufactured by Du Pont-Toray Co. Ltd.) which was to serve as an insulation layer 23 and a 60 μm-thick epoxy-based heat adhesive sheet which was to serve as an organic adhesive layer 22 were prepared, and the film and the sheet were temporarily attached to each other at 130° C. using a roll laminator (lamination apparatus), thereby producing an organic adhesive-attached insulation film.

Next, the organic adhesive-attached insulation film was cut into a shape which was the same shape as the electrostatic adsorption electrode 12 and included a fixing hole used to fix a power-feeding terminal 13 formed in a central portion using a molding machine.

Next, the cut organic adhesive-attached insulation film was attached to the electrostatic adsorption electrode 12 in the electrostatic chuck, thermally pressed at a reduced pressure of 10 Pa or less under conditions of 160° C. and 5 MPa using a vacuum thermal pressing machine, the organic adhesive-attached insulation film was thermally pressed onto the electrostatic adsorption electrode 12 in the electrostatic chuck, and an organic adhesive layer 22 and an insulation layer 23 were stacked on the electrostatic adsorption electrode 12.

Meanwhile, a base portion 31 made of aluminum having an alumited surface was prepared. The base portion 31 had a disc shape with a diameter of 330 mm and a thickness of 25 mm, and included the flow path 32, which allowed a cooling medium to flow, formed therein and a fixing hole used to fix the power-feeding terminal 13 formed in the central portion.

Next, the top surface 31a of the base portion 31 on an electrostatic chucking portion 2 side was defatted and washed using acetone, and a sheet-like organic adhesive made of an acryl resin was attached to the top surface 31a, thereby producing an organic adhesive layer 33. Next, the heat radiation plate 34 made of aluminum which had the same shape as the organic adhesive layer 33 was mounted on a predetermined location of the organic adhesive layer 33, and pressurized, thereby attaching and fixing the heat radiation plate 34 onto the organic adhesive layer 33. Then, a cooling base portion 3 including the organic adhesive layer 33 and the heat radiation plate 34 sequentially stacked on the top surface 31a of the base portion 31 was produced.

Next, the power-feeding terminal 13 was produced by grinding tungsten (W).

The surface roughness Ra was set to 0.1 μm by etching an end surface 13a of the power-feeding terminal 13.

Next, a molding material containing aluminum oxide ($Al_2O_3$) and a binder was molded into a predetermined size and a predetermined shape, and the obtained compact was fired at 1300° C. in the atmosphere for 4 hours, thereby producing the insulation member 21.

Next, the power-feeding terminal 13 and an insulator 15 were engaged and fixed to the fixing holes in the cooling base portion 3, and an organic adhesive was loaded in recess portions formed by the heat radiation plate 34 and the inside of the insulation member 21 in the cooling base portion 3 to a predetermined depth.

Next, the insulation layer 23 of the electrostatic chucking portion 2 was moved onto the organic adhesive of the cooling base portion 3, the electrostatic chucking portion 2 was pressurized to the cooling base portion 3 at a predetermined pressure, and then heated at 120° C. for 12 hours so as to cure the organic adhesive, thereby producing an organic adhesive layer 24, whereby an electrostatic chucking device of Example 1 was obtained.

(Evaluation of the Electrostatic Chucking Device)

The uniformity of heat transfer in the electrostatic chucking device and the presence of cracking or fracture were evaluated.

The evaluation method is as described below.

(1) The Uniformity of Heat Transfer

A silicon wafer having a diameter of 300 mm was mounted on the top surface of the plate-like body of the electrostatic chucking device, the silicon wafer was electrostatically adsorbed while a current was made to flow in the electrostatic adsorption electrode 12, and the in-plane temperature distribution of the silicon wafer when 20° C. cooling water was circulated in the flow path in the cooling base portion was measured using a thermography TVS-200EX (manufactured by Nippon Avionics Co., Ltd.).

As a result, the variation in the in-plane temperature distribution of the silicon wafer was within ±0.5° C.

(2) The Presence of Cracking or Fracture

The top surface of the plate-like body in the electrostatic chucking device was observed using a metallograph, and the presence of cracking or fracture was investigated.

As a result, the occurrence of cracking or fracture was not observed on the top surface of the plate-like body.

Example 2

An electrostatic chucking device of Example 2 was produced according to Example 1 except that the plate-like body 11 was changed from yttrium aluminum garnet (YAG) to samarium oxide-added yttrium aluminum garnet (YAG.Sm) obtained by adding 10% by mass of samarium oxide ($Sm_2O_3$) to yttrium aluminum garnet (YAG), and the electrostatic chucking device was evaluated.

As a result, the variation in the in-plane temperature distribution of the silicon wafer was within ±0.5° C., and the occurrence of cracking or fracture was not observed on the top surface of the plate-like body.

Example 3

An electrostatic chucking device of Example 3 was produced according to Example 1 except that the plate-like body 11 was changed from yttrium aluminum garnet (YAG) to gadolinium oxide-added yttrium aluminum garnet (YAG.Gd) obtained by adding 10% by mass of gadolinium oxide ($Gd_2O_3$) to yttrium aluminum garnet (YAG), and the electrostatic chucking device was evaluated.

As a result, the variation in the in-plane temperature distribution of the silicon wafer was within ±0.5° C., and the occurrence of cracking or fracture was not observed on the top surface of the plate-like body.

Example 4

An electrostatic chucking device of Example 4 was produced according to Example 1 except that the plate-like body 11 was changed from yttrium aluminum garnet (YAG) to carbon nanotube (CNT)-added yttrium oxide obtained by adding 0.5% by mass of a carbon nanotube (CNT) to yttrium oxide ($Y_2O_3$), and the electrostatic chucking device was evaluated.

As a result, the variation in the in-plane temperature distribution of the silicon wafer was within ±1° C., and the occurrence of cracking or fracture was not observed on the top surface of the plate-like body.

Example 5

An electrostatic chucking device of Example 5 was produced according to Example 1 except that the insulation member 21 was changed from aluminum oxide ($Al_2O_3$) to silica ($SiO_2$), and the electrostatic chucking device was evaluated.

As a result, the variation in the in-plane temperature distribution of the silicon wafer was within ±1° C., and the occurrence of cracking or fracture was not observed on the top surface of the plate-like body.

Example 6

An electrostatic chucking device of Example 6 was produced according to Example 1 except that the heat radiation plate 34 was changed from aluminum to titanium, and the electrostatic chucking device was evaluated.

As a result, the variation in the in-plane temperature distribution of the silicon wafer was within ±1.5° C., and the occurrence of cracking or fracture was not observed on the top surface of the plate-like body.

Comparative Example 1

An electrostatic chucking device of Comparative Example 1 was produced according to Example 1 except that an aluminum oxide ($Al_2O_3$) sintered compact was used as the plate-like body 11, and the insulation member 21 and the heat radiation plate 34 were not provided, and the electrostatic chucking device was evaluated.

As a result, the variation in the in-plane temperature distribution of the silicon wafer was within ±3° C., which was larger than the variations in the in-plane temperature distribution in Examples 1 to 6.

In addition, it was observed that a number of fine cracks were generated on the top surface of the plate-like body.

Comparative Example 2

An electrostatic chucking device of Comparative Example 2 was produced according to Example 1 except that a complex sintered compact including aluminum oxide ($Al_2O_3$) and silicon oxide ($SiO_2$) was used as the plate-like body 11, and the insulation member 21 and the heat radiation plate 34 were not provided, and the electrostatic chucking device was evaluated.

As a result, the variation in the in-plane temperature distribution of the silicon wafer was within ±3° C., which was larger than the variations in the in-plane temperature distribution in Examples 1 to 6.

In addition, it was observed that the top surface of the plate-like body fractured.

REFERENCE SIGNS LIST

1 ELECTROSTATIC CHUCKING DEVICE
2 ELECTROSTATIC CHUCKING PORTION
3 COOLING BASE PORTION
11 PLATE-LIKE BODY
11a TOP SURFACE (ONE PRINCIPAL SURFACE)
11b BOTTOM SURFACE (THE OTHER PRINCIPAL SURFACE)
12 ELECTROSTATIC ADSORPTION ELECTRODE
13 POWER-FEEDING TERMINAL
13a END SURFACE
14 PROTRUSION PORTION
21 INSULATION MEMBER
22 ORGANIC ADHESIVE LAYER
23 INSULATION LAYER
24 ORGANIC ADHESIVE LAYER
31 BASE PORTION (BASE STAGE)
31a TOP SURFACE (ONE PRINCIPAL SURFACE)
32 FLOW PATH
33 ORGANIC ADHESIVE LAYER
34 HEAT RADIATION PLATE
41 ELECTROSTATIC CHUCKING DEVICE
42 ELECTROSTATIC CHUCKING PORTION
43 ORGANIC ADHESIVE LAYER
44 INSULATION LAYER
51 ELECTROSTATIC CHUCKING DEVICE
52 ELECTROSTATIC CHUCKING PORTION
53 INSULATION LAYER
W PLATE-LIKE SPECIMEN

The invention claimed is:

1. An electrostatic chucking device comprising:
an electrostatic chucking portion which includes a plate-like body, a principal surface of which is used as a mounting surface that mounts a plate-like specimen, an electrostatic adsorption electrode provided in the plate-like body and a power-feeding terminal that applies a direct-current voltage on the electrostatic adsorption electrode; and
a base stage that is provided on the other principal surface and supports the electrostatic chucking portion,
wherein the plate-like body is made of a corrosion-resistant ceramic, and
a circular insulation member is provided in a circumferential edge portion between the electrostatic chucking portion and the base stage, and a heat radiation plate is provided on a principal surface of the base stage on an electrostatic chucking portion side.

2. The electrostatic chucking device according to claim 1, wherein the corrosion-resistant ceramic is made of one or two or more selected from a group consisting of yttrium aluminum oxide composite oxides, rare earth element-added yttrium aluminum oxide composite oxides and yttrium oxide.

3. The electrostatic chucking device according to claim 1, wherein the heat radiation plate is made of metal or an organic resin having thermal conductivity.

4. The electrostatic chucking device according to claim 1, wherein the mounting surface includes a plurality of protrusion portions having a diameter smaller than the thickness of the plate-like specimen.

5. The electrostatic chucking device according to claim 1, wherein the surface roughness Ra of an end surface of the power-feeding terminal on an electrostatic adsorption electrode side is in a range of 0.05 µm to 1.0 µm.

6. The electrostatic chucking device according to claim 1, wherein an insulation layer is provided under the electrostatic adsorption electrode, and the insulation layer and the heat radiation plate are adhered to each other via an organic adhesive layer.

7. The electrostatic chucking device according to claim 6, wherein the circular insulation member is provided to surround the electrostatic adsorption electrode, the organic adhesive layer and the heat radiation plate, and the distance between the electrostatic adsorption electrode and the base stage is larger than the distance between the circular insulation member and the base stage.

8. The electrostatic chucking device according to claim 1, wherein the circular insulation member is made of an insulating ceramic which has a thermal conductivity which is larger than that of the corrosion-resistant ceramic of the plate-like body.

* * * * *